United States Patent
Hartz

(10) Patent No.: US 11,961,565 B2
(45) Date of Patent: Apr. 16, 2024

(54) MULTI-PROGRAM OF MEMORY CELLS WITHOUT INTERVENING ERASE OPERATIONS

(71) Applicant: Micron Technology, Inc., Boise, ID (US)

(72) Inventor: Ezra Edward Hartz, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 17/669,197

(22) Filed: Feb. 10, 2022

(65) Prior Publication Data

US 2023/0094379 A1   Mar. 30, 2023

Related U.S. Application Data

(60) Provisional application No. 63/250,746, filed on Sep. 30, 2021.

(51) Int. Cl.
*G11C 16/00*   (2006.01)
*G11C 16/10*   (2006.01)
(Continued)

(52) U.S. Cl.
CPC ............ *G11C 16/14* (2013.01); *G11C 16/102* (2013.01); *G11C 16/26* (2013.01); *G11C 16/30* (2013.01); *G11C 16/3404* (2013.01)

(58) Field of Classification Search
CPC . G11C 16/0483; G11C 11/5628; G11C 16/10; G11C 16/16; G11C 16/26; G11C 16/3404; G11C 16/3445; G11C 16/14; G11C 16/3459; G11C 11/5635; G11C 16/30; G11C 16/08; G11C 2211/5621; G11C 11/5642; G11C 16/3409; G11C 11/5671; G11C 16/102; G11C 16/24; G11C 16/0466; G11C 16/34; G11C 16/12; G11C 16/3427; G11C 16/3495; G11C 16/3454; G11C 16/349; G11C 16/32; G11C 16/344; G11C 16/345; G11C 16/3468; G11C 16/20; G11C 16/3472; G11C 16/3477; G11C 2216/18; G11C 16/04; G11C 16/3413; G11C 16/3436; G11C 2211/5641; G11C 2211/5648; G11C 7/02; G11C 7/04; G11C 11/56; G11C 11/5678; G11C 13/0002;
(Continued)

(56) References Cited

U.S. PATENT DOCUMENTS 11,568,943 B2 *   1/2023   Pitner .................... G11C 16/10

* cited by examiner

*Primary Examiner* — Thong Q Le
(74) *Attorney, Agent, or Firm* — Lowenstein Sandler LLP

(57) ABSTRACT

A memory device includes an array of memory cells configured as single-level cell memory and control logic operatively coupled with the array of memory cells. The control logic is to perform operations including: causing first data to be programmed to a plurality of memory cells of the array of memory cells, the first data including a first erase distribution programmed below an erase threshold voltage (Vt) level and a first voltage distribution programmed relative to a first Vt level; and causing, without erasing the plurality of memory cells, second data to be programmed to the plurality of memory cells, the second data including a second erase distribution programmed relative to the first Vt level and a second voltage distribution programmed relative to a second Vt level.

18 Claims, 14 Drawing Sheets

700

Cause first data to be programmed to memory cells of an array of SLC memory cells, the first data including a first erase distribution programmed below an erase Vt level and a first voltage distribution programmed relative to a first Vt level.
710

Causing, without erasing the memory cells, second data to be programmed to the memory cells, the second data including a second erase distribution programmed relative to a second Vt level and a second voltage distribution programmed relative to a third Vt level.
720

(51) Int. Cl.
*G11C 16/14* (2006.01)
*G11C 16/26* (2006.01)
*G11C 16/30* (2006.01)
*G11C 16/34* (2006.01)

(58) Field of Classification Search
CPC .............. G11C 13/0004; G11C 13/004; G11C 13/0069; G11C 16/0433; G11C 16/06; G11C 16/3418; G11C 16/3463; G11C 16/3486; G11C 2013/0083; G11C 2211/5642; G11C 29/04; G11C 29/52; G11C 5/025; G11C 5/147; G11C 7/1048; G11C 8/08; G11C 8/12; H10B 43/27; H10B 41/27; G06F 3/0604; G06F 3/064; G06F 3/0652; G06F 3/0679; G06F 12/02; G06F 12/0246; G06F 2212/1016; G06F 2212/7206
USPC .... 365/185.29, 185.03, 185.11, 185.24, 148, 365/185.19, 185.2, 185.22, 185.23, 365/230.03
See application file for complete search history.

700

Cause first data to be programmed to memory cells of an array of SLC memory cells, the first data including a first erase distribution programmed below an erase Vt level and a first voltage distribution programmed relative to a first Vt level.
710

Causing, without erasing the memory cells, second data to be programmed to the memory cells, the second data including a second erase distribution programmed relative to a second Vt level and a second voltage distribution programmed relative to a third Vt level.
720

Cause first data to be programmed to memory cells of an array of memory cells, the first data including an erase distribution programmed below an erase Vt level and multiple first voltage distributions programmed relative to multiple first Vt levels.
910

Cause, without erasing the plurality of memory cells, second data to be programmed to the memory cells, the second data including multiple second voltage distributions programmed relative to multiple second Vt levels, the multiple second Vt levels being higher than a highest Vt level of the multiple first Vt levels.
920

FIG. 9

MULTI-PROGRAM OF MEMORY CELLS WITHOUT INTERVENING ERASE OPERATIONS

REFERENCE TO RELATED APPLICATION

This application claims the benefit of U.S. Provisional Patent Application No. 63/250,746, filed Sep. 30, 2021, the entirety of which is incorporated herein by reference.

TECHNICAL FIELD

Embodiments of the disclosure are generally related to memory sub-systems, and more specifically, relate to multi-program of memory cells without intervening erase operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 7 is a flow diagram of an example method of performing sequential program operations at a group of memory cells configured as single-level cell memory and without performing intervening erase operations according to at least some embodiments.

FIG. 9 is a flow diagram of an example method of performing sequential program operations at a group of memory cells configured as multi-level cell memory and without performing intervening erase operations according to at least one embodiment.

DETAILED DESCRIPTION

Figure 1A:
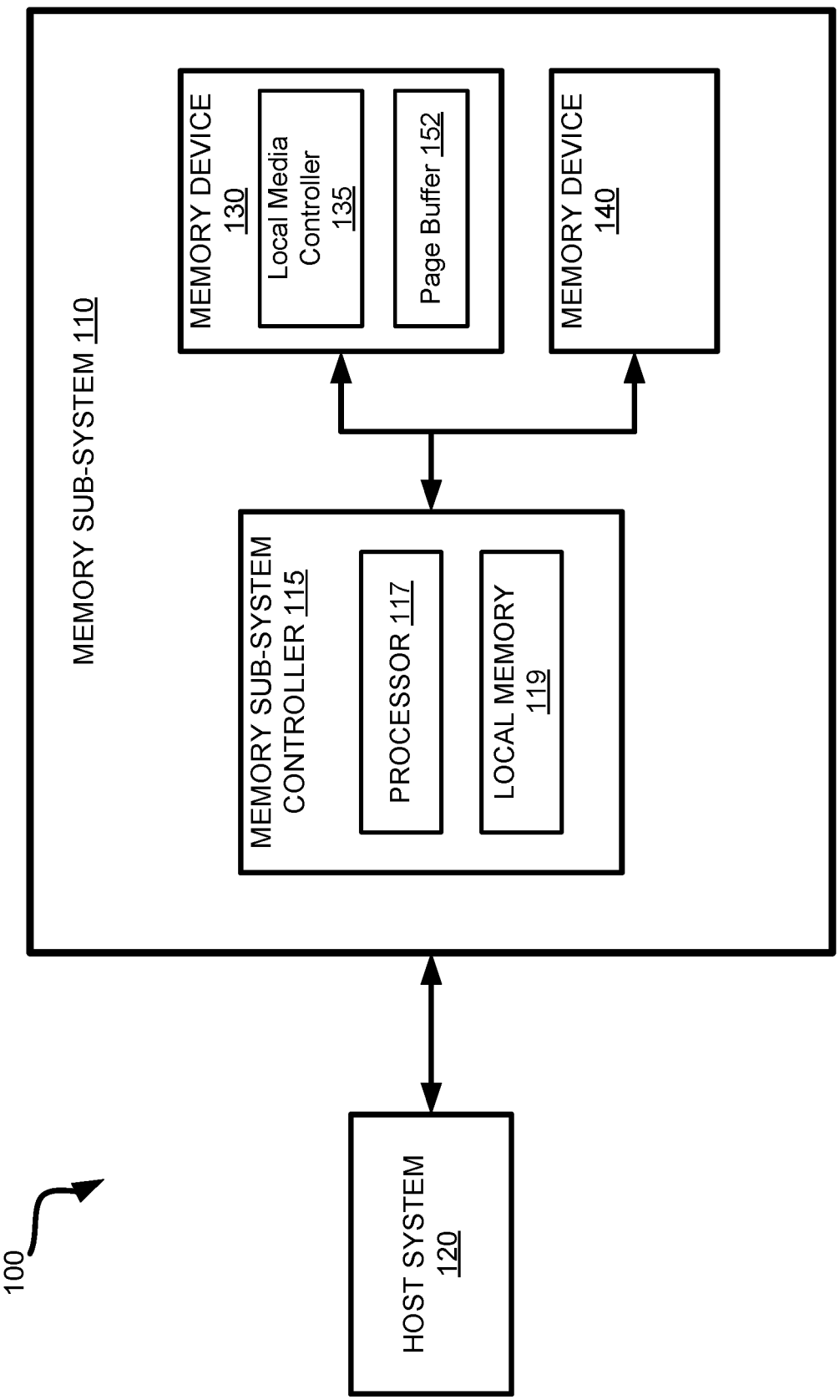
FIG. 1A illustrates an example computing system that includes a memory sub-system in accordance with some embodiments.

Embodiments of the present disclosure are directed to multi-program of memory cells without intervening erase operations. In certain memory devices, control logic causes memory cells of an array of memory cells to be erased before being programmed, e.g., in order to refresh data stored in the memory cells after a certain period of time or to program new data to the memory cells. This arrangement of program and erase operations imparts program stress on physical blocks of memory cells, and when repeated often, cause a memory device to wear out and reach an end-of-life (EOL) status sooner. Program/erase (PE) cycles also require the time to program and erase the blocks for each cycle, where erase operations are time consuming and make up a large percentage of the PE cycles. As the value in memory such as negative-and (NAND) memory is speed and performance, reducing the time needed to program or erase blocks can be performed by optimizing control logic present on each die, through algorithms in a memory sub-system controller, to include firmware operation, and through other memory device design options, as will be discussed herein.

Aspects of the present disclosure address the above and other deficiencies through foregoing the intervening erase operations between program operations on the memory cells. By pushing logical data states into higher voltage levels during each subsequent program operation, sequential programming of data can be performed on the memory cells without requiring erase operations in between each program. For example, in some operations, control logic is operatively coupled with the array of memory cells configured as single-level cell (SLC) memory. In at least some embodiments, the control logic performs operations including causing first data to be programmed to a group of memory cells of the array of memory cells, the first data including a first erase distribution programmed below an erase threshold voltage (Vt) level and a first voltage distribution programmed relative to a first Vt level. The operations can further include causing, without erasing the group of memory cells, second data to be programmed to the group of memory cells, the second data including a second erase distribution programmed relative to a second Vt level and a second voltage distribution programmed relative to a third Vt level.

In these embodiments, the second Vt level is higher than the first Vt level and the third Vt level is higher than the second Vt level due to subsequent programming without erase, which, for example, shifts the erase distribution above the second Vt level to form the second erase distribution and shifts the first voltage distribution above the third Vt level to form the second voltage distribution. In these embodiments, being "relative" to a threshold voltage can be a voltage range relative to a program verify voltage, read voltage, or the like, as will be discussed further. Further, one or more flag bits can be set to indicate which Vt levels to refer when reading the data out of the memory cells, e.g., in order to reference the correct read voltage(s) depending on to which Vt level(s) the data is programmed.

In at least some additional embodiments, the array of memory cells is configured as multi-level cell (MLC) memory, to include cells configured as tri-level cell (TLC) memory, such that sequentially-performed program operations program multiple logical data states to increasingly higher voltage levels. In these embodiments, the control logic can perform operations including causing first data to be programmed to a group of memory cells of the array of memory cells, the first data including an erase distribution programmed below an erase Vt level and multiple first voltage distributions programmed relative to multiple first Vt levels. In these embodiments, the operations can further include causing, without erasing the group of memory cells, second data to be programmed to the group of memory cells, the second data including multiple second voltage distributions programmed relative to multiple second Vt levels. In these embodiments, the multiple second Vt levels are higher than a highest Vt level of the multiple first Vt levels. In the embodiments disclosed herein, once the group of memory cells runs out of higher Vt levels to which to program, the control logic causes the group of memory cells to be erased, e.g., after a predetermined number of programming operations have been performed on the group of memory cells.

Therefore, advantages of the systems and methods implemented in accordance with some embodiments of the present disclosure include, but are not limited to, reducing the overhead time required to program these memory devices, therefore greatly improving overall performance. This overhead time still includes some number of erase operations, but much fewer than previously, with a greatest time savings in SLC memory. Further, this reduction in PE cycles significantly reduces stress imparted to the memory cells being programmed in the memory device, extending the lifespan of the memory device, including improving scheduling for cell capability to reach full life targets. Additionally, a group of memory cells (such as a block) that is already programmed can be programmed again, such that data can be re-programmed to the same group of memory cells without erasing the group or needing another physical group of memory cells to which to program, e.g., to refresh data. The disclosed operations can also simplify garbage collection and associated algorithms that track stale data, with potentially more efficient tracking of data stored at page level (instead of block level) for performing garbage collection. Other advantages will be apparent to those skilled in the art of performance optimization in operating programmable memory devices, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can provide the circuitry used to program data to the memory cells of the memory device 130 and to read the data out of the memory cells. In some embodiments, control logic of the local media controller 135 can implement or direct the program operations and other related operations herein that avoid intervening erase operations. For example, the control logic can direct multiple program operations to the same group or block of memory cells without intervening erase operations, as described in more detail below. In some embodiments, this control logic is integrated in whole or in part within the memory sub-system controller 115 and/or the host system 120.

Figure 1B:
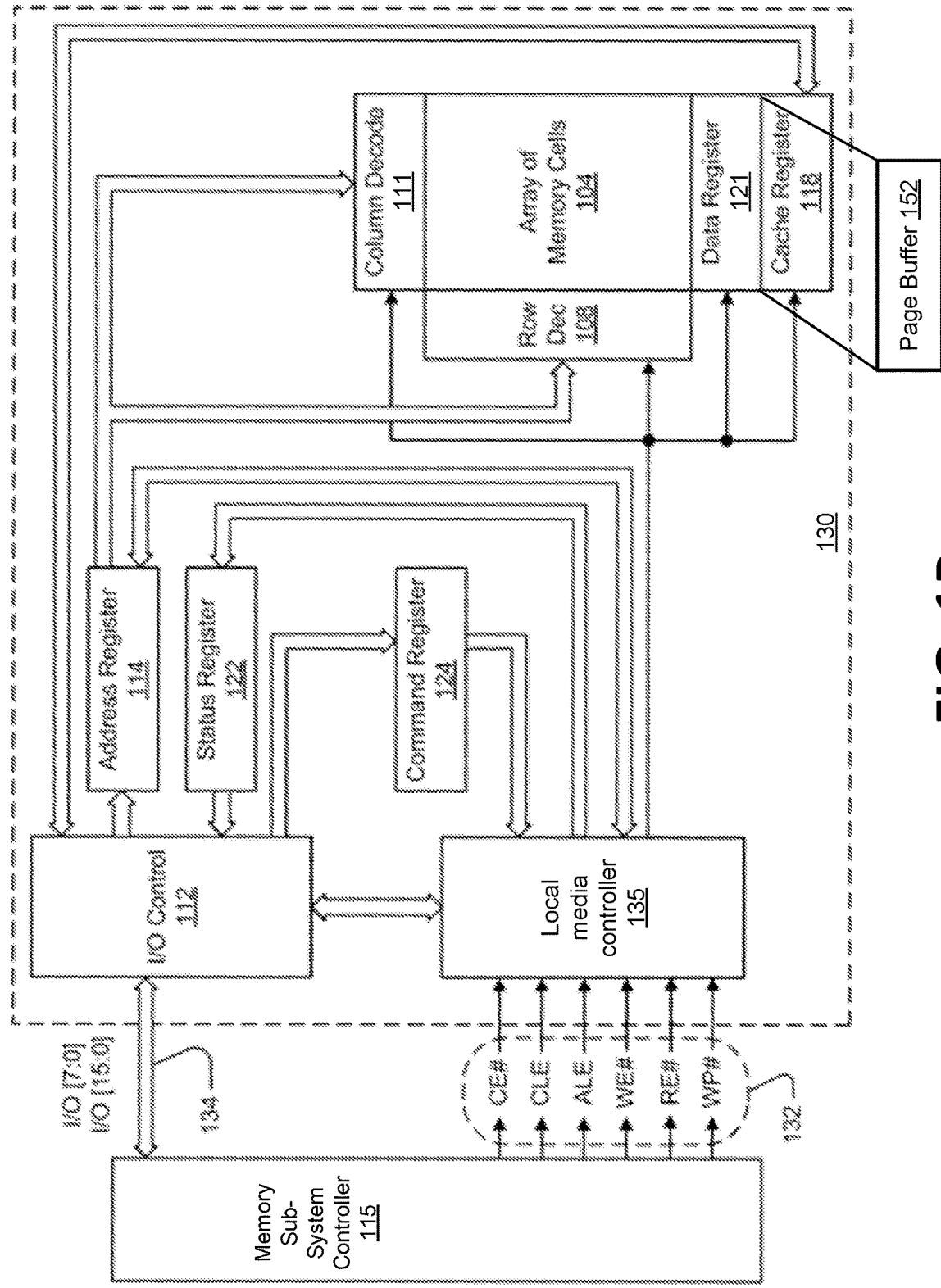
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
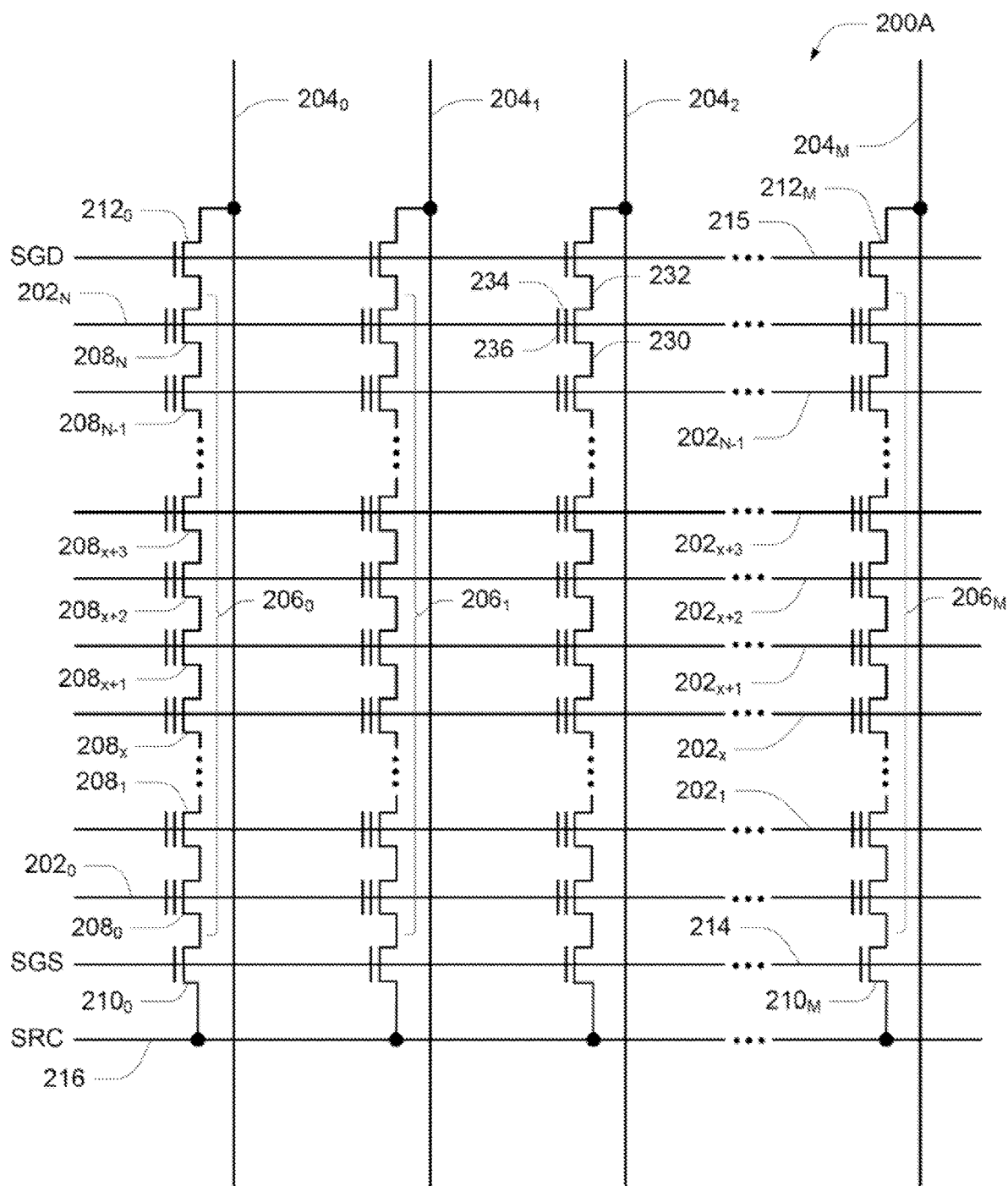
FIG. 2A-2C are schematics of portions of an array of memory cells as could be used in a memory of the type described with reference to FIG. 1B according to an embodiment.
Figure 2B:
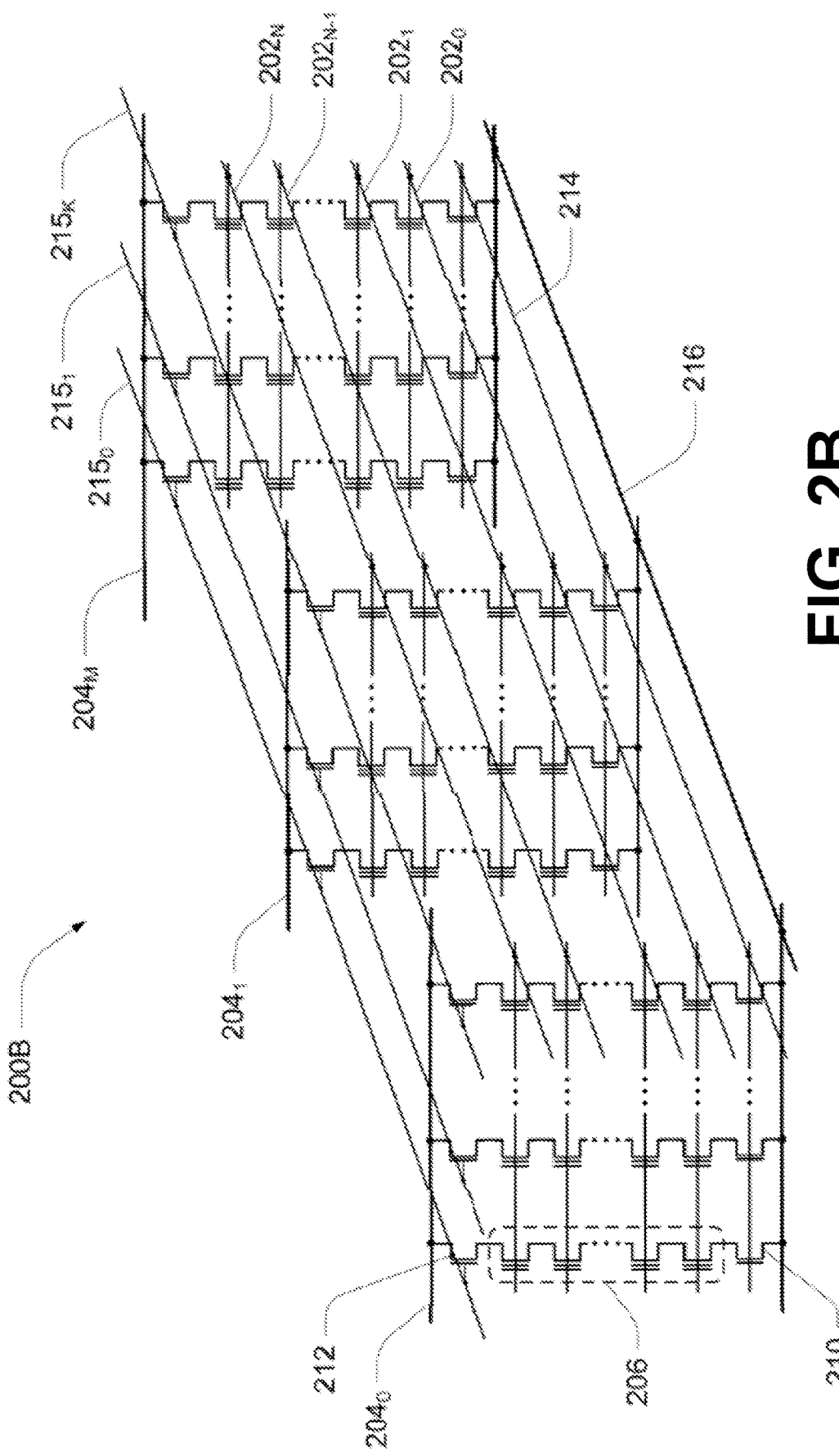
Figure 2C:
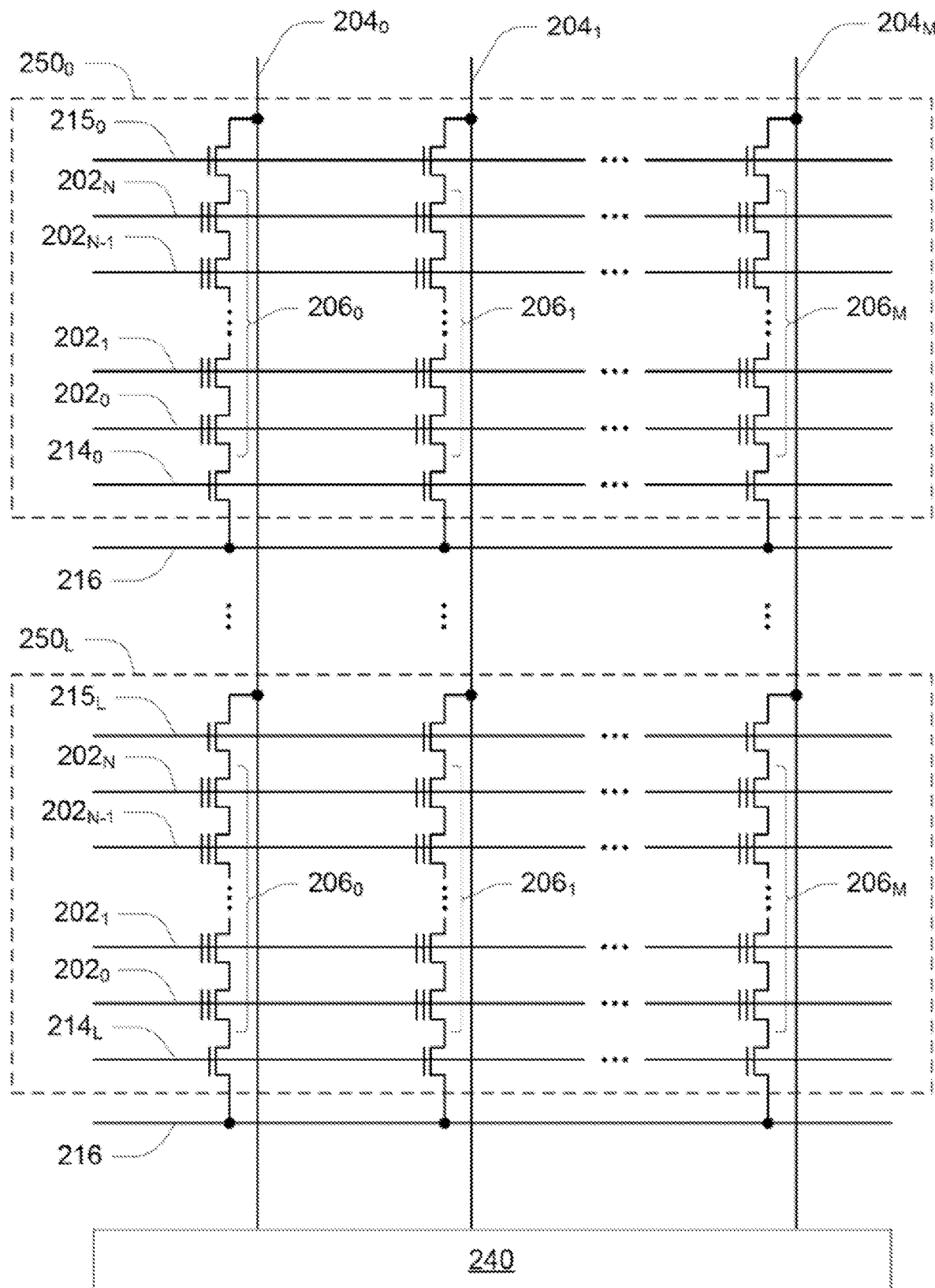

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

Figure 3:
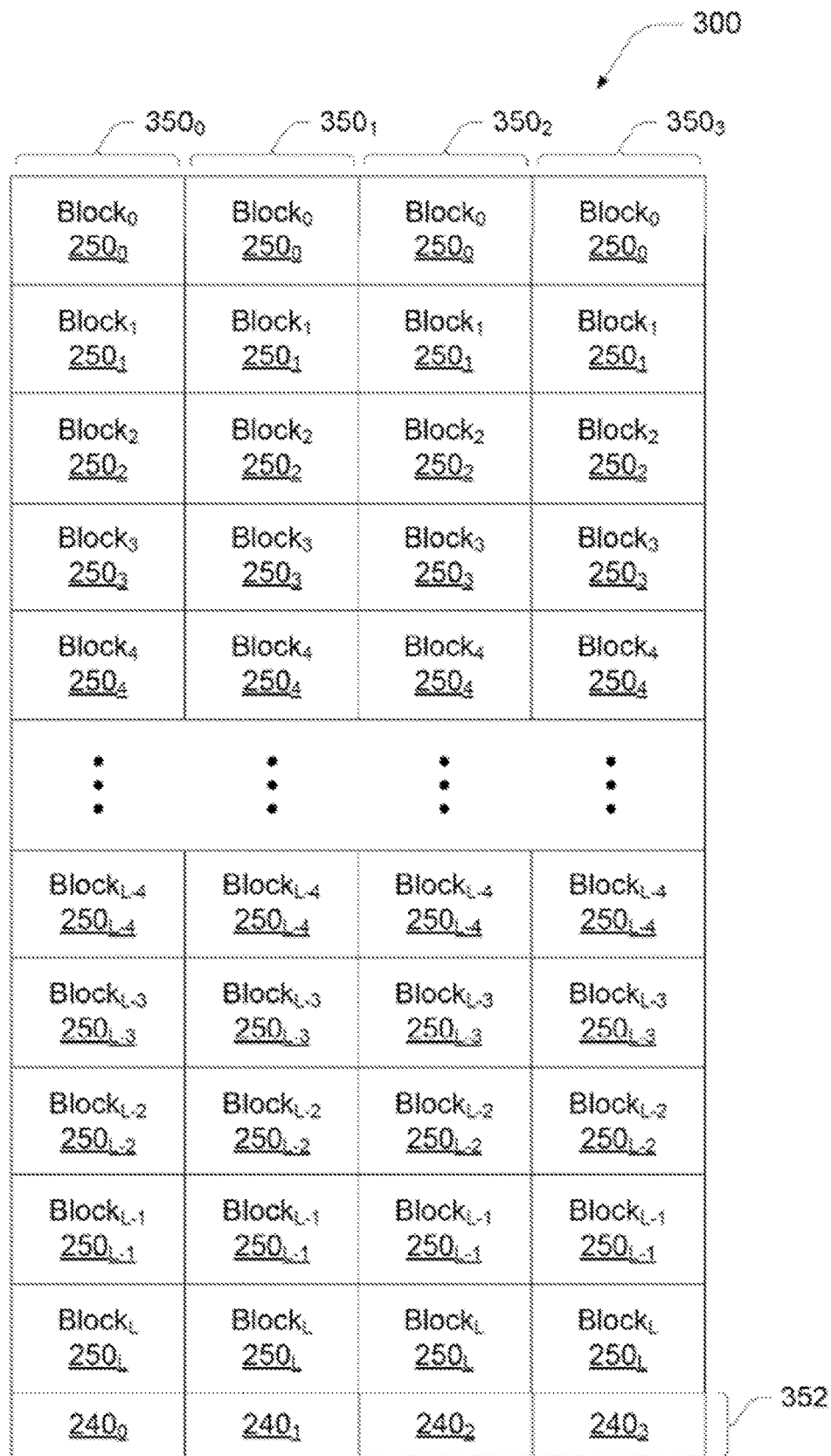
FIG. 3 is a block schematic of a portion of an array of memory cells as could be used in a memory of the type described with reference to FIG. 1B according to an embodiment.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
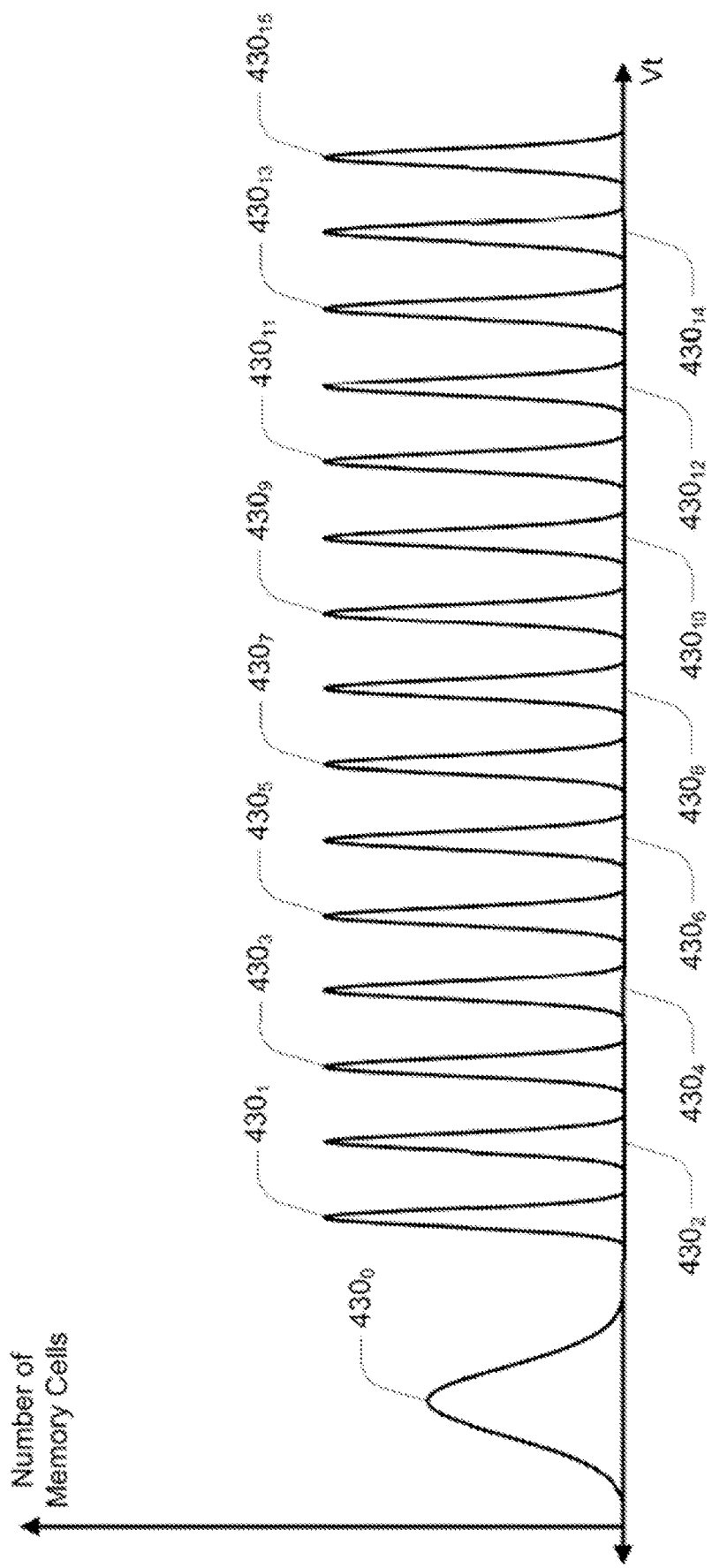
FIG. 4 is a conceptual depiction of threshold voltage distributions of multiple memory cells of a memory array according to an embodiment

FIG. 4 is a conceptual depiction of threshold voltage ranges of multiple memory cells. FIG. 4 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ can tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$, and $430_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case can be storing a data state L0 having a data value of logical '1111' and is typically referred to as the erased state of the memory cell. If the threshold voltage is within the second of the sixteen threshold voltage ranges $430_1$, the memory cell in this case can be storing a data state L1 having a data value of logical '0111'. If the threshold voltage is within the third of the sixteen threshold voltage ranges $430_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5:
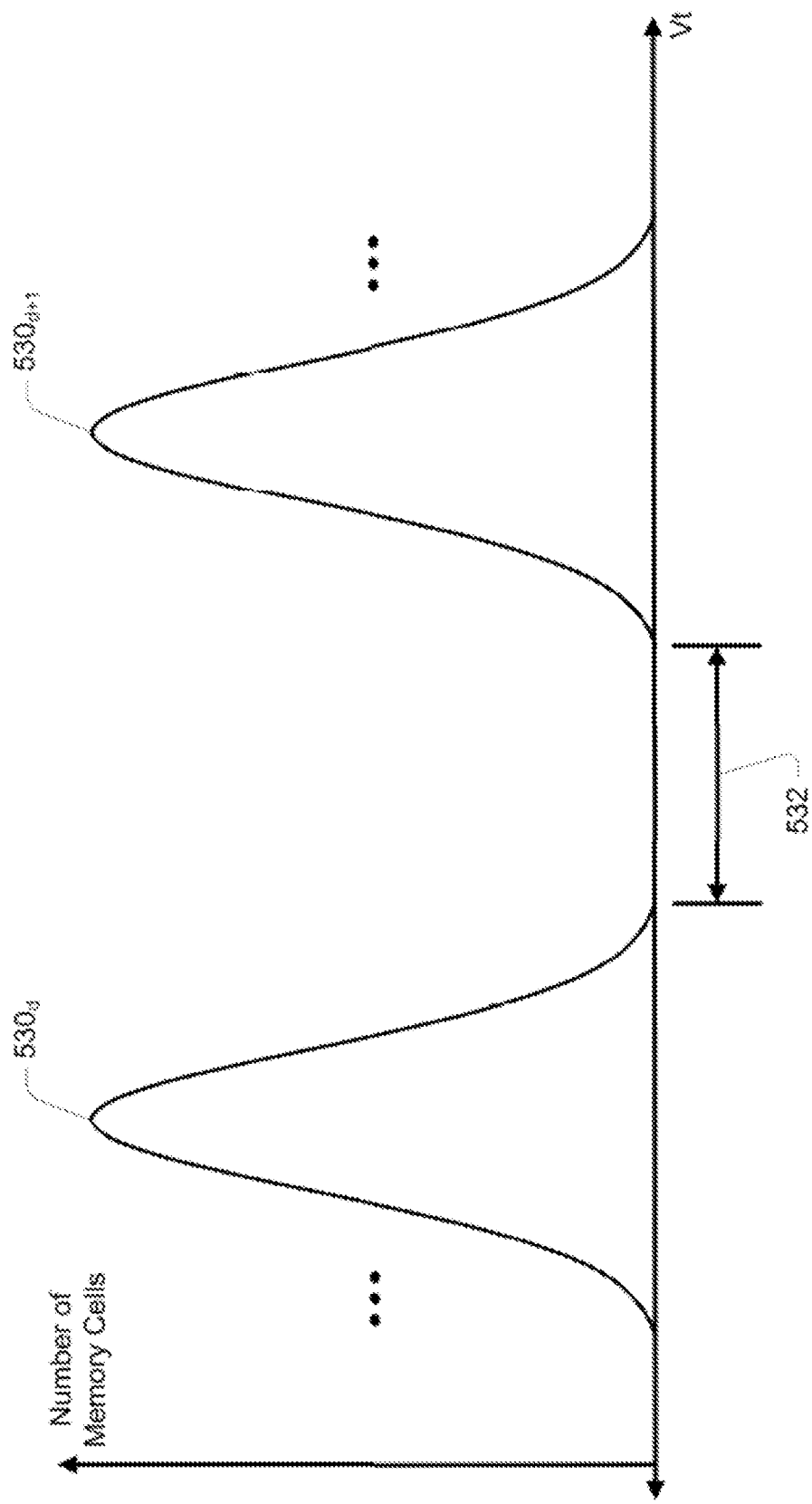
FIG. 5 is a conceptual depiction of a threshold voltage distribution of multiple memory cells at one stage following programming for use with various embodiments.

FIG. 5 is a conceptual depiction of a threshold voltage distribution of multiple memory cells following a programming operation. The threshold voltage distributions $530_d$-$530_{d+1}$ of FIG. 5 can represent some portion of the distributions for threshold voltage ranges $430_0$-$430_{15}$ of FIG. 4 at the completion of a programming operation for memory cells. With reference to FIG. 5, adjacent threshold voltage distributions 530 are typically separated by some margin 532 (e.g., dead space) at the completion of programming. Applying a sense voltage (e.g., read voltage) within the margin 532 to the control gates of the multiple memory cells can be used to distinguish between the memory cells of the threshold voltage distribution $530_d$ (and any lower threshold voltage distribution) and the memory cells of the threshold voltage distribution $530_{d+1}$ (and any higher threshold voltage distribution).

Figure 6A:
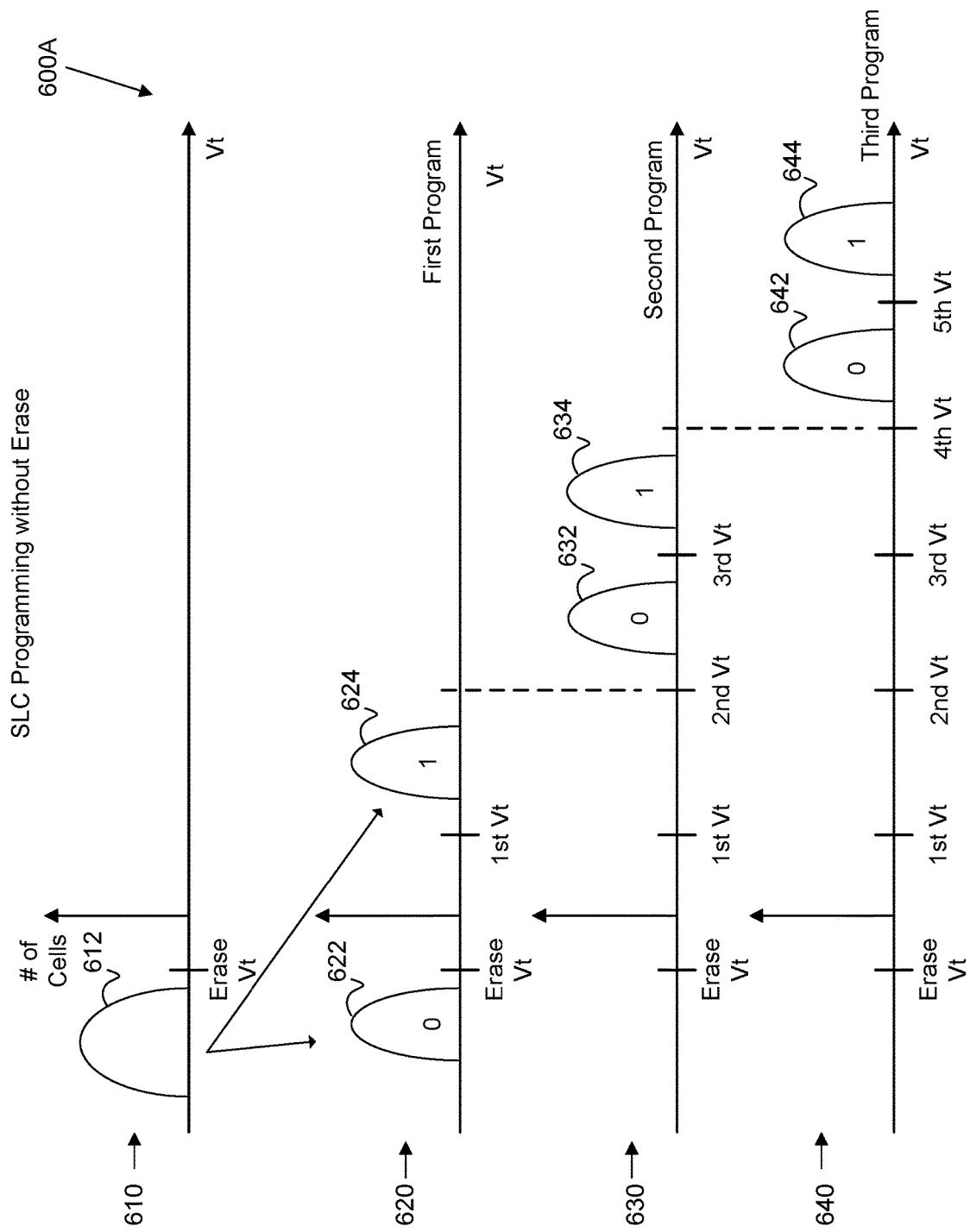
FIG. 6A is a set of graphs illustrating a series of sequential program operations performed at a group of memory cells configured as single-level cell memory and without performing intervening erase operations according to at least one embodiment.

FIG. 6A is a set of graphs 600A illustrating a series of sequential program operations performed at a group of memory cells configured as single-level cell (SLC) memory and without performing intervening erase operations according to at least one embodiment. At operation 610, the data state of the group of memory cells is an erase state, in which the cells are programmed below an erase threshold voltage (Vt) and form an erase distribution 612.

In at least some embodiments, at operation 620, the local media controller 135, e.g., control logic, performs a first program operation, which, for example, causes first data to be programmed to the group of memory cells of the array of memory cells. The first data includes the cells programmed below the erase threshold voltage (Vt) level, which form a first erase distribution 622 and cells programmed relative to a first Vt level, which form a first voltage distribution 624. For example, the first voltage distribution 624 can include memory cells programmed to a voltage greater than the first Vt level. In one embodiment, the memory cells programmed to the erase distribution 612 remain at the same voltage level(s) below the erase Vt level and also form part of the first erase distribution 622. Other memory cells from the erase distribution 612 are programmed to higher voltage level(s) above the first Vt level and become part of the first voltage distribution 624. As illustrated, the first erase distribution 622 can indicate a state of a zero value ("0") while the first voltage distribution 624 can indicate a state of a one value ("1"), although the opposite can be true in other embodiments and is thus illustrated for purposes of explanation. Thus, the "data" herein can be understood to refer to one or more programmed states associated with voltage distributions spread across memory cells.

In various embodiments, the erase and Vt levels discussed herein can be associated with, or identical to, program verify voltages, read voltages, or the like that correspond to a threshold voltage level between voltage distributions and that can be referenced to determine the state of the voltage distribution. Thus, in some embodiments, the illustrated erase and Vt levels are not illustrated to scale and can be understood to be closer to the distribution that is to be read after programming occurs.

In at least some embodiments, at operation 630, without first performing an erase operation, the control logic causes second data to be programmed to the group of memory cells. The second data includes the cells programmed relative to a second Vt level, which form a second erase distribution 632 and cells programmed relative to a third Vt level, which form a second voltage distribution 634. More specifically, in one embodiment, the memory cells from the first erase distribution 622 are further programmed and thus shifted above the second Vt level to become part of the second erase distribution 632. Further, the memory cells from the first voltage distribution 624 are further programmed and thus shifted above the third Vt level to become part of the second voltage distribution 634. In these embodiments, the second Vt level is higher than the first Vt level and the third Vt level is higher than the second Vt level, e.g., as illustrated in moving to the increasing Vt direction. Further, as illustrated, the second erase distribution 632 can indicate a state of a zero value ("0") while the second voltage distribution 634 can indicate a state of a one value ("1"), although the opposite can be true in other embodiments and is thus illustrated for purposes of explanation. In some embodiments, the second data is one of refreshed first data or new data that is different than the first data.

In various embodiments, the control logic further performs an operation that includes setting one or more flag bits associated with the group of memory cells, the one or more flag bits to indicate the second data is programmed relative to the first Vt level and to the second Vt level. In other words, the one or more flag bits can indicate later to the control logic (or other processing logic) to establish a read voltage for the second erase distribution 632 at the second Vt level and to establish a read voltage for the second voltage distribution 634 at the third Vt level. The one or more flag bits can then be updated again for each sequential program operation to the same group of memory cells, to indicate higher Vt levels for higher read voltage(s). Thus, the flag bits can include multiple bits in order to represent many higher sets of Vt levels.

In these and related embodiments, the one or more flag bits can be stored in a memory cell of one of the second erase distribution, the second voltage distribution, or another memory cell that is mapped to the group of memory cells. The one or more flag bits can also be stored in local memory or cache of the memory device 130, to include optionally in the page buffer 152, or in a page or block mapping table that contains metadata for the physical pages or one or more physical blocks of the group of memory cells. In some embodiments, the one or more flag bits are stored with or associated with an indicator of type of memory (e.g., SLC, MLC, TLC). Thus, during a read operation, the control logic can know the type of memory and at what threshold voltage levels to search to determine the data states of the programmed cells.

In at least some embodiments, at operation 640, without performing an erase operation, the control logic causes third data to be programmed to the group of memory cells. The third data includes cells programmed relative to a fourth Vt level, which form a third erase distribution 642 and cells programmed relative to a fifth Vt level, which form a third voltage distribution 644. In one embodiment, the memory cells from the second erase distribution 632 are further programmed and thus shifted above the fourth Vt level to form the third erase distribution 642. Further, the memory cells from the second voltage distribution 634 are further programmed and thus shifted above the fifth Vt level to become part of the third voltage distribution 644. In these embodiments, the fourth Vt level is higher than the third Vt level and the fifth Vt level is higher than the fourth Vt level. In this way, the SLC data of different sequentially performed program operations is programmed (e.g., shifted) into sequentially higher Vt ranges by repeating operations such as operations 630 and 640, and thus can be programmed relative to sequentially higher Vt levels. As with operation 630, the control logic, following operation 640, can set the one or more flag bits (or new flag bits) to indicate the third data is programmed relative to the fourth Vt level and to the fifth Vt level.

In these embodiments, during each program operation, the newly programmed data (e.g., one or more data states), can be refreshed data that was previously stored in the memory cells or can be new data that is not merely refreshed data. In either case, an erase operation is avoided and refreshed data need not be programmed to a new group of memory cells, e.g., can be programmed to higher Vt levels of the same memory cells. Further, the control logic can perform operations that include causing the group of memory cells to be erased after a predetermined number of programming operations have been performed at the group of memory cells. This is because, depending on the type of memory (e.g., SLC or other MLC memory), the available Vt ranges will be exhausted within any given group of memory cells and will eventually be erased before starting the operations of FIG. 6A over again.

Figure 6B:
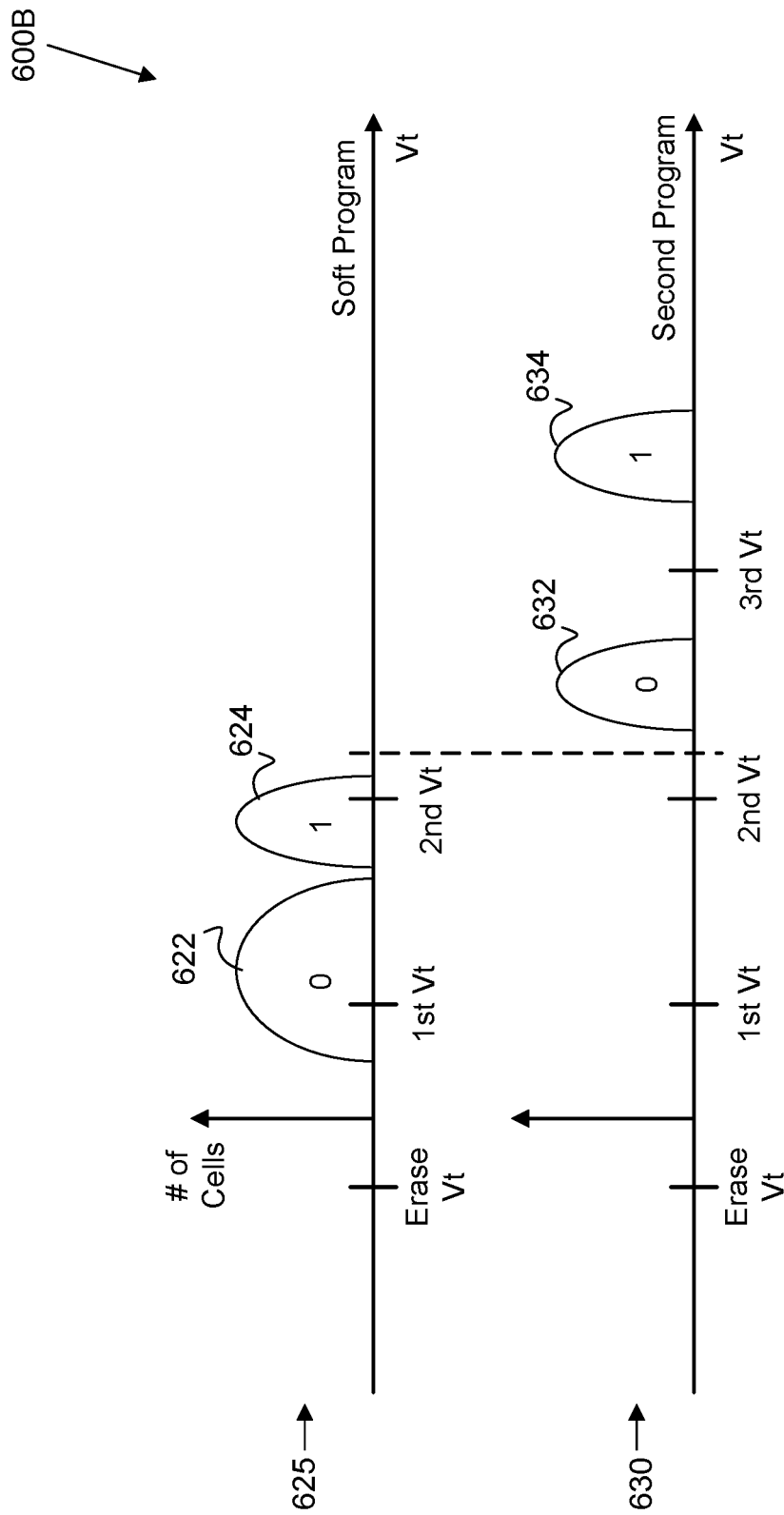
FIG. 6B is a set of graphs illustrating an example of an intervening soft program between two of the sequential program operations illustrated in FIG. 6A according to at least one embodiment.

FIG. 6B is a set of graphs 600B illustrating an example of an intervening soft program between two of the sequential program operations illustrated in FIG. 6A according to at least one embodiment. At operation 625, the operations performed by the control logic can further include, before causing the second data to be programmed, causing a soft program to be performed on the first erase distribution 622 to narrow a margin between the first erase distribution 622 and the first voltage distribution 624, and to widen the first erase distribution 622. This soft program can be caused by a soft program pulse that increased the Vt level of the voltage distributions only partly, e.g., not to the extent of a full program. A soft program may be performed to make the initial voltage distributions (e.g., of the first erase distribution 622 and the first Vt distribution 624) more uniform and at a voltage level to be cleanly programmed up beyond the final second Vt level and the third Vt level, respectively, as discussed with reference to operation 630 (FIG. 6A). As can be observed, at operation 630 after a soft program, the second erase distribution 632 is programmed completely above the highest memory cells programmed with the first voltage distribution 624. Certain program operations or memory devices may include certain performance and reliability specifications, which may also, therefore, employ such soft program operations.

FIG. 7 is a flow diagram of an example method 700 of performing sequential program operations at a group of memory cells configured as single-level cell memory and without performing intervening erase operations according to at least some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the local media controller 135 (e.g., control logic) of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, first erase/voltage distributions are programmed. More specifically, the processing logic causes the first data to be programmed to a group of memory cells of the array of memory cells, as discussed with reference to operation 620 (or operations 620 and 625) of FIGS. 6A-6B. The first data, for example, can include a first erase distribution programmed below an erase Vt level and a first voltage distribution programmed relative to a first Vt level.

At operation 720, second erase/voltage distributions are programmed. More specifically, the processing logic causes, without erasing the group of memory cells, second data to be programmed to the group of memory cells, as discussed with reference to operation 630 (or operations 625 and 630) of FIGS. 6A-6B. The second data, for example, can include a second erase distribution programmed relative to a second Vt level and a second voltage distribution programmed relative to a third Vt level. In various embodiments, operation 720 can be repeated multiple times as the Vt levels at which the voltage distributions are programmed are sequentially increased to higher Vt levels.

Figure 8:
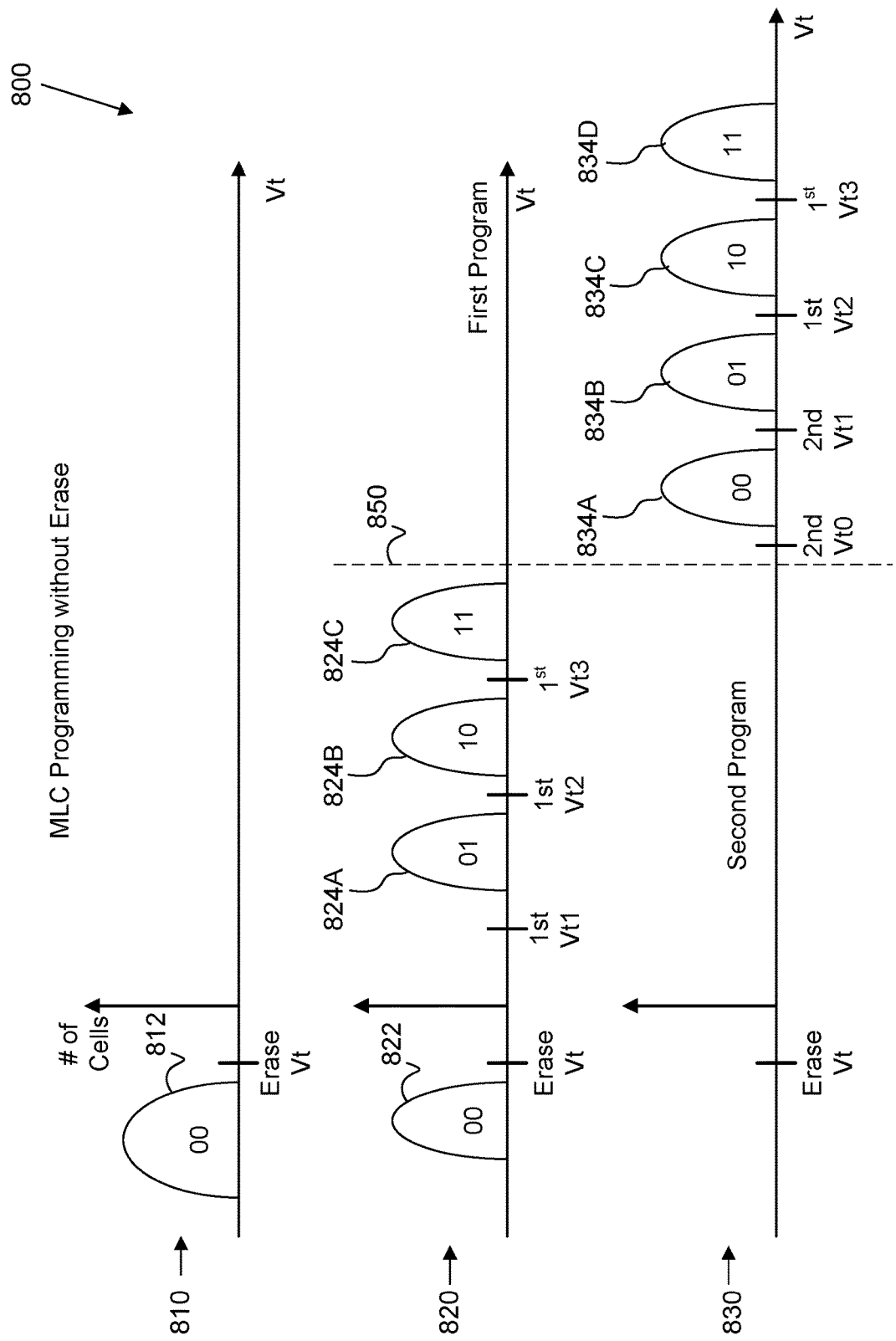
FIG. 8 is a set of graphs illustrating a series of sequential program operations performed at a group of memory cells configured as multi-level cell memory and without performing intervening erase operations according to at least one embodiment.

FIG. 8 is a set of graphs 800 illustrating a series of sequential program operations performed at a group of memory cells configured as multi-level cell (MLC) memory and without performing intervening erase operations according to at least one embodiment. At operation 810, the data state of the group of memory cells is an erase state, in which an erase distribution 812 is programmed below an erase threshold voltage (Vt).

In at least some embodiments, at operation 820, the local media controller 135, e.g., control logic performs a first program operation, which, for example, causes first data to be programmed to a group of memory cells of the array of memory cells. In some embodiments, the first data includes a first erase distribution 822 programmed below an erase Vt level and multiple first voltage distributions 824A-824C programmed relative to multiple first Vt levels, which are illustrated as $1^{st}$ Vt1, $1^{st}$ Vt2, $1^{st}$ Vt3, respectively. For example, the first voltage distributions 824A, 824B, and 824C can be programmed above a first threshold voltage, a second threshold voltage, and a third threshold voltage of the multiple first Vt levels, respectively. More specifically, according to some embodiments, the memory cells programmed to the erase distribution 812 remain at the same voltage level(s) below the erase Vt level and also form part of the first erase distribution 822. Other memory cells from the erase distribution 812 are programmed to higher voltage level(s) above the first ($1^{st}$ Vt1) of the multiple first Vt levels, as illustrated at operation 820. As illustrated, the first erase distribution 822 can indicate a state of a zero value ("00") while the multiple first voltage distributions can indicate states of values 01, 10, and 11. In some embodiments, however, the erase distribution can correspond to a state of a three value ("11"), and the multiple first voltage distributions can correspond to values 01, 00, and 10. Thus, the "data" herein can be understood to refer to one or more programmed states associated with voltage distributions spread across memory cells.

In at least some embodiments, at operation 830, the control logic further performs operations that include causing second data to be programmed to the group of memory cells without performing an intervening erase operation. In these embodiments, the second data includes multiple second voltage distributions 824A-824C programmed relative to multiple second Vt levels, which are illustrated as $2^{nd}$ Vt0, $2^{nd}$ Vt1, $2^{nd}$ Vt2, $3^{rd}$ Vt3, respectively. In these embodiments, the multiple second Vt levels are higher than a highest Vt level of the multiple first Vt levels. More specifically, in one embodiment, the memory cells from the first erase distribution 822 are further programmed and thus shifted above the first Vt level ($2^{nd}$ Vt0) of the multiple second voltage Vt levels to form a first voltage distribution 834A of the multiple second voltage distributions. Further, memory cells from each of a first, a second, and a third of the multiple second voltage distributions 824A, 824B, and 824C, respectively, are further programmed and thus shifted above a second ($2^{nd}$ Vt1), a third ($2^{nd}$ Vt2), and a fourth ($2^{nd}$ Vt3) of the multiple second voltage Vt levels to become a part of a second voltage distribution 834B, a third voltage distribution 834C, and a fourth voltage distribution 834D of the multiple second voltage distributions, respectively.

For example, the third Vt distribution 824C (illustrated as representing a "11" value) at operation 820 can be located between the highest Vt level ($1^{st}$ Vt3) and a threshold voltage 850 that is at or beyond an upper edge of the third Vt distribution 824C of the multiple first voltage distributions. Thus, the multiple second Vt levels can be located beyond (or higher than) the fourth Vt level ($1^{st}$ Vt3) of the four first Vt levels relative to which are programmed the memory cells at operation 820.

In various embodiments, operation 830 can be repeated for additional multiple voltage distributions programmed at still higher Vt levels to sequentially program additional MLC data to the same group of memory cells with performing an intervening erase operation. In some embodiments, the control logic further performs operations including setting one or more flag bits associated with the group of memory cells, the one or more flag bits to indicate the second data is programmed relative to the multiple second Vt levels ($2^{nd}$ Vt0, $2^{nd}$ Vt1, $2^{nd}$ Vt2, $3^{rd}$ Vt3). In other words, the flag bit can indicate later to the control logic (or other processing logic) where to establish a read voltage for each of the multiple second voltage distributions, respectively. In the example of FIG. 8, these read voltages can be associated with, or correspond to, the multiple second Vt levels ($2^{nd}$ Vt0, $2^{nd}$ Vt1, $2^{nd}$ Vt2, and $2^{nd}$ Vt3). In this way, the control logic will know where to look to do a read after the second program operation to the group of cells (operation 830). As further program operations are performed on the same group of memory cells, the one or more bit flags can further be altered to indicate shifts in the voltage distributions being programmed to higher respective Vt levels. As an extension to the operations of FIG. 8, the control logic can perform similar sets of operations for memory cells configured as QLC memory or PLC memory by shifting to voltage levels above the previously-programmed voltage distributions of the memory cells.

In various embodiments, with continued reference to FIG. 8, the control further performs operations to cause the group of memory cells to be erased after a predetermined number of programming operations have been performed at the plurality of memory cells. Because of the multiple voltage distributions (e.g., four in this MLC memory example) programmed during each program operation, there will be fewer program operations possible before needing to erase the group of memory cells, but the savings compared to performing an erase operation between each program operation is still significant. The control logic can further, as was discussed with reference to FIG. 6B relevant to SLC memory, perform operations including, before causing the second data to be programmed (at operation 830), causing a soft program to be performed on the erase distribution to narrow a margin between the erase distribution and a first voltage distribution of the multiple first voltage distributions. The soft program can also make the margins between all four voltage distributions more uniform and otherwise to prepare for the full program at operation 830, for example.

FIG. 9 is a flow diagram of an example method 900 of performing sequential program operations at a group of memory cells configured as multi-level cell memory and without performing intervening erase operations according to at least one embodiment. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the local media controller 135 (e.g., control logic) of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, first erase/voltage distributions are programmed. More specifically, the processing logic causes first data to be programmed to a group of memory cells of the array of memory cells. In these embodiments, the first data includes an erase distribution programmed below an erase Vt level and multiple first voltage distributions programmed relative to multiple first Vt levels, as discussed with reference to operation 820 of FIG. 8.

At operation 920, second voltage distributions are programmed. More specifically, the processing logic causes second data to be programmed to the group of memory cells. In these embodiments, the second data includes multiple second voltage distributions programmed relative to multiple second Vt levels, the multiple second Vt levels being higher than a highest Vt level of the multiple first Vt levels, as discussed with reference to operation 830 of FIG. 8. In some embodiments, a soft program is performed on the group of memory cells between operation 910 and operation 920. For example, the processing logic can first cause a soft program pulse to create the initial voltage distributions of the multiple second voltage distributions before being full programmed as illustrated at operation 830 in FIG. 8.

Figure 10:
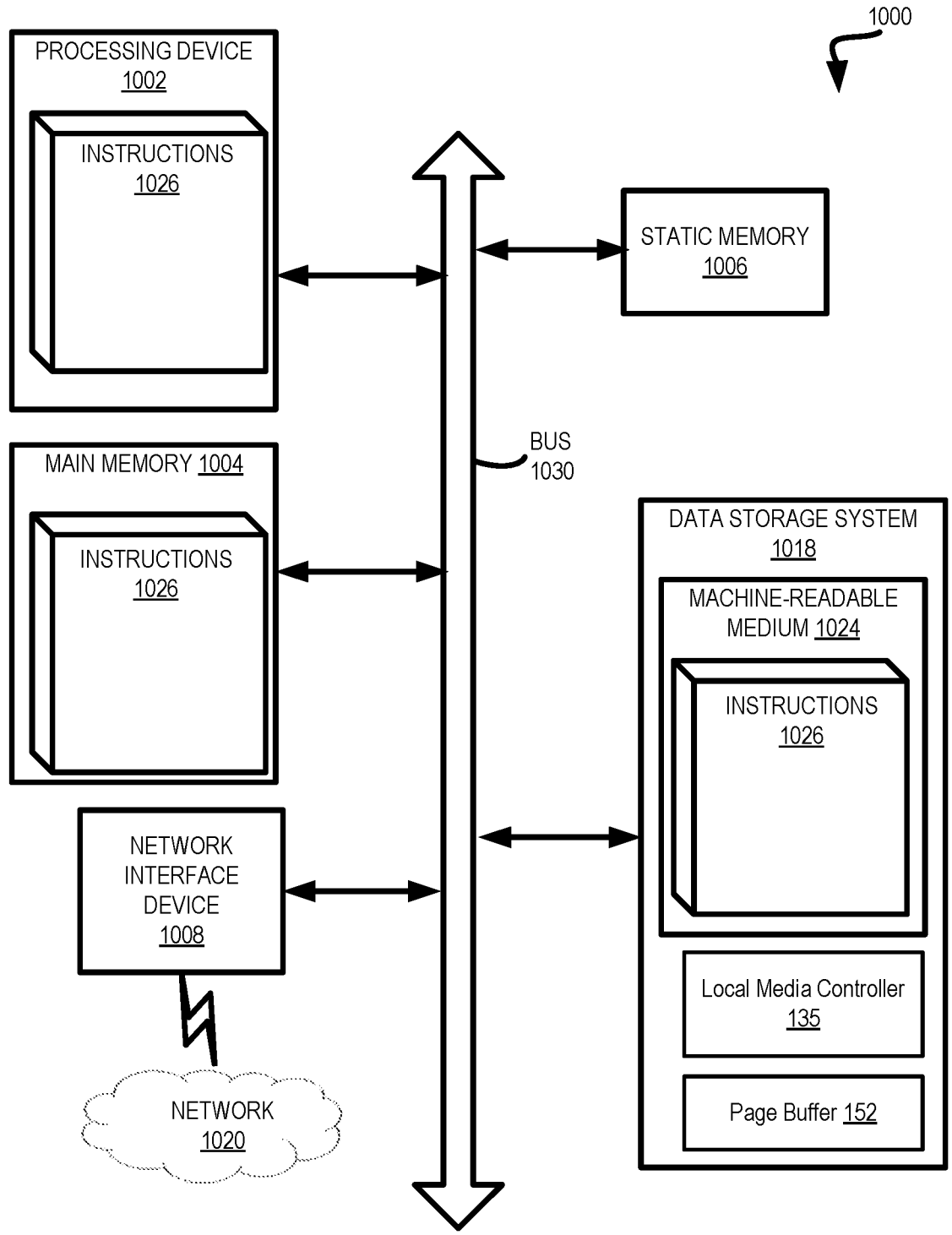
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1010 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1028 for performing the operations and steps discussed herein. The computer system 1000 can further include a network interface device 1012 to communicate over the network 1020.

The data storage system 1018 can include a machine-readable storage medium 1024 (also known as a computer-readable medium) on which is stored one or more sets of instructions 1028 or software embodying any one or more of the methodologies or functions described herein. The data storage system 1018 can further include the local media controller 135 and the page buffer 152 or 352 that were previously discussed. The instructions 1028 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1A.

In one embodiment, the instructions 1026 include instructions to implement functionality corresponding to a controller (e.g., the memory sub-system controller 115 of FIG. 1A).

While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
an array of memory cells configured as single-level cell memory; and
control logic operatively coupled with the array of memory cells, the control logic to perform operations comprising:
causing first data to be programmed to a plurality of memory cells of the array of memory cells, the first data comprising a first erase distribution programmed below an erase threshold voltage (Vt) level and a first voltage distribution programmed relative to a first Vt level; and
causing, without erasing the plurality of memory cells, second data to be programmed to the plurality of memory cells, the second data comprising a second erase distribution programmed relative to a second Vt level and a second voltage distribution programmed relative to a third Vt level, wherein the second Vt level is higher than the first Vt level and the third Vt level is higher than the second Vt level.

2. The memory device of claim 1, wherein the second data is one of refreshed first data or new data that is different than the first data.

3. The memory device of claim 1, wherein the operations further comprise setting one or more flag bits associated with the plurality of memory cells, the one or more flag bits to indicate the second data is programmed relative to the second Vt level and to the third Vt level.

4. The memory device of claim 1, wherein the operations further comprise causing, without erasing the plurality of memory cells, third data to be programmed to the plurality of memory cells, the third data comprising a third erase distribution programmed relative to a fourth Vt level and a third voltage distribution programmed relative to a fifth Vt level.

5. The memory device of claim 4, wherein the fourth Vt level is higher than the third Vt level and the fifth Vt level is higher than the fourth Vt level.

6. The memory device of claim 1, wherein the operations further comprise causing the plurality of memory cells to be erased after a predetermined number of programming operations have been performed at the plurality of memory cells.

7. The memory device of claim 1, wherein the operations further comprise, before causing the second data to be programmed, causing a soft program to be performed on the first erase distribution to narrow a margin between the first erase distribution and the first voltage distribution.

8. A method comprising:
causing, by control logic of a memory device comprising an array of memory cells configured as single-level cell memory, first data to be programmed to a plurality of memory cells of the array of memory cells, the first data comprising a first erase distribution programmed below an erase Vt level and a first voltage distribution programmed relative to a first Vt level; and
causing, by the control logic, without erasing the plurality of memory cells, second data to be programmed to the plurality of memory cells, the second data comprising a second erase distribution programmed relative to a second Vt level and a second voltage distribution programmed relative to a third Vt level, wherein the second Vt level is higher than the first Vt level and the third Vt level is higher than the second Vt level.

9. The method of claim 8, wherein the second data is one of refreshed first data or new data that is different than the first data.

10. The method of claim 8, further comprising setting one or more flag bits associated with the plurality of memory cells, the one or more flag bits to indicate the second data is programmed relative to the second Vt level and to the third Vt level.

11. The method of claim 8, further comprising causing, without erasing the plurality of memory cells, a third data to be programmed to the plurality of memory cells, the third data comprising a third erase distribution programmed relative to a fourth Vt level and a third voltage distribution programmed relative to a fifth Vt level.

12. The method of claim 11, wherein the fourth Vt level is higher than the third Vt level and the fifth Vt level is higher than the fourth Vt level.

13. The method of claim 8, further comprising causing the plurality of memory cells to be erased after a predetermined number of programming operations have been performed at the plurality of memory cells.

14. The method of claim 8, further comprising, before causing the second data to be programmed, causing a soft program to be performed on the first erase distribution to narrow a margin between the first erase distribution and the first voltage distribution.

15. A method comprising:
causing, by control logic of a memory device comprising an array of memory cells configured as multi-level cell memory, first data to be programmed to a plurality of memory cells of the array of memory cells, the first data comprising an erase distribution programmed below an erase Vt level and multiple first voltage distributions programmed relative to multiple first Vt levels; and
causing, by the control logic without erasing the plurality of memory cells, second data to be programmed to the plurality of memory cells, the second data comprising multiple second voltage distributions programmed relative to multiple second Vt levels, the multiple second Vt levels being higher than a highest Vt level of the multiple first Vt levels.

16. The method of claim 15, further comprising setting one or more flag bits associated with the plurality of memory cells, the one or more flag bits to indicate the second data is programmed relative to the multiple second Vt levels.

17. The method of claim 15, further comprising causing the plurality of memory cells to be erased after a predetermined number of programming operations have been performed at the plurality of memory cells.

18. The method of claim 15, further comprising, before causing the second data to be programmed, causing a soft program to be performed on the erase distribution to narrow a margin between the erase distribution and a first voltage distribution of the multiple first voltage distributions.

\* \* \* \* \*